United States Patent [19]

Miki et al.

[11] Patent Number: 5,450,444
[45] Date of Patent: Sep. 12, 1995

[54] DIGITAL AM TRANSMITTER

[75] Inventors: Nobuyuki Miki, Kawasaki; Haruhiko Yura, Yokohama, both of Japan

[73] Assignee: Kabushiki Kaisha Toshiba, Kawasaki, Japan

[21] Appl. No.: 275,415

[22] Filed: Jul. 15, 1994

[51] Int. Cl.$^6$ ............... H04L 27/04; H04L 27/12; H04L 27/20
[52] U.S. Cl. .................. 375/295; 455/108; 375/271; 329/350; 329/347; 332/149; 332/159
[58] Field of Search ............... 375/59, 41; 455/108; 329/347, 348, 350; 332/149, 150, 159

[56] References Cited

U.S. PATENT DOCUMENTS

| | | |
|---|---|---|
| 4,580,111 | 4/1986 | Swanson . |
| 4,675,619 | 6/1987 | Uchibori et al. ............... 375/41 X |
| 4,804,931 | 2/1989 | Holick ............... 332/31 R |

FOREIGN PATENT DOCUMENTS

| | | |
|---|---|---|
| 0327682 | 8/1989 | European Pat. Off. . |
| 4-313838 | 11/1992 | Japan . |
| 5-067168 | 3/1993 | Japan . |
| 5-067177 | 3/1993 | Japan . |

OTHER PUBLICATIONS

International Broadcasting Convention, Jul. 1992, T. Yamaguchi, et al., "Development of High Power Medium-Wave Radio Transmitter With SIT", pp. 29–33.

*Primary Examiner*—Stephen Chin
*Assistant Examiner*—Bryan Webster
*Attorney, Agent, or Firm*—Oblon, Spivak, McClelland, Maier & Neustadt

[57] ABSTRACT

A digital AM transmitter according to the invention converts a audio signal to a digital audio signal of a plurality of bits by an A/D converter, outputs a logical code signal of "1" from each of those output terminals of a code unit, whose number corresponds to the digital value of the digital audio signal, selectively generates driving signals from those output terminals of a code shifter which are equal in number to the logical code signals of "1" from the code unit, while changing the driving-signal-generating output terminals of the code shifter from one to another (or some to others) with the lapse of time, selectively guiding, with the use of carrier wave switches, those portions of a carrier wave signal which have been divided by a carrier wave divider, to power amplifiers in accordance with driving signals generated from the code shifter, amplifies the guided portions of the carrier wave signal by power amplifiers, combined the amplified portions of the carrier wave signal by a combiner, and passes the combined signal through a band filter, thereby generating an amplitude modulation wave.

6 Claims, 8 Drawing Sheets

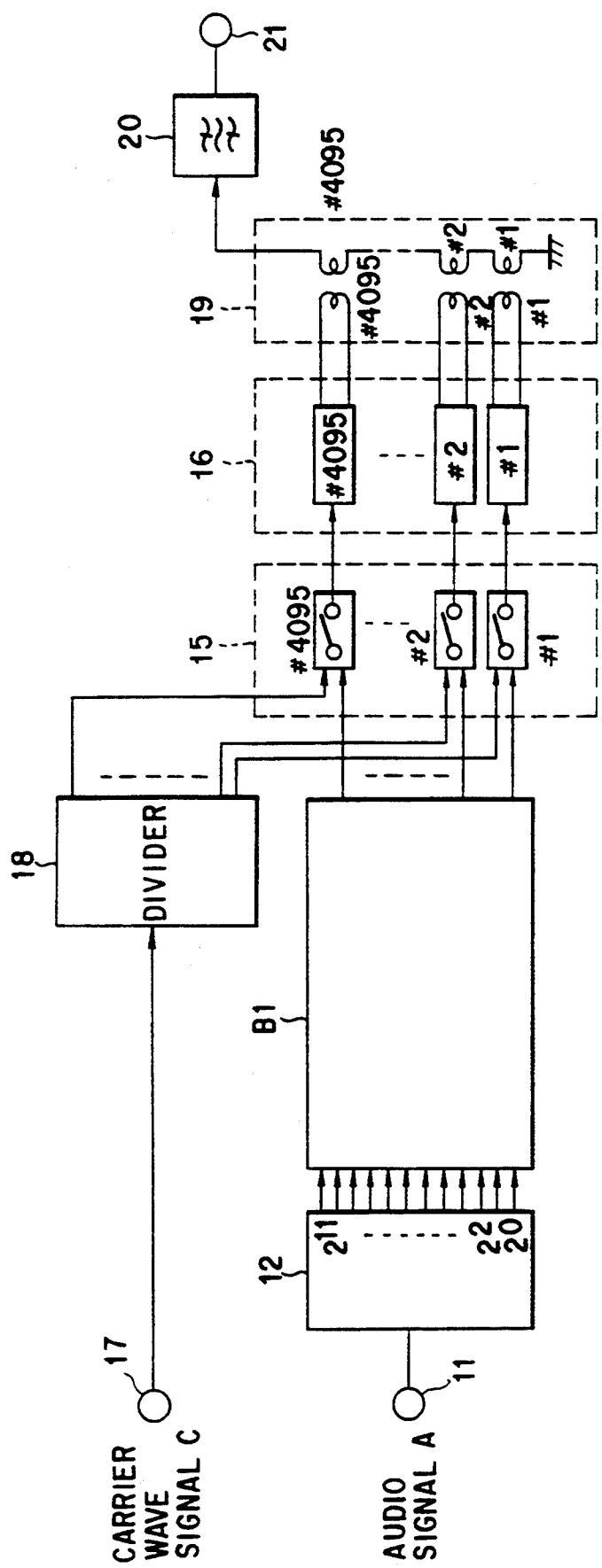
F I G. 5

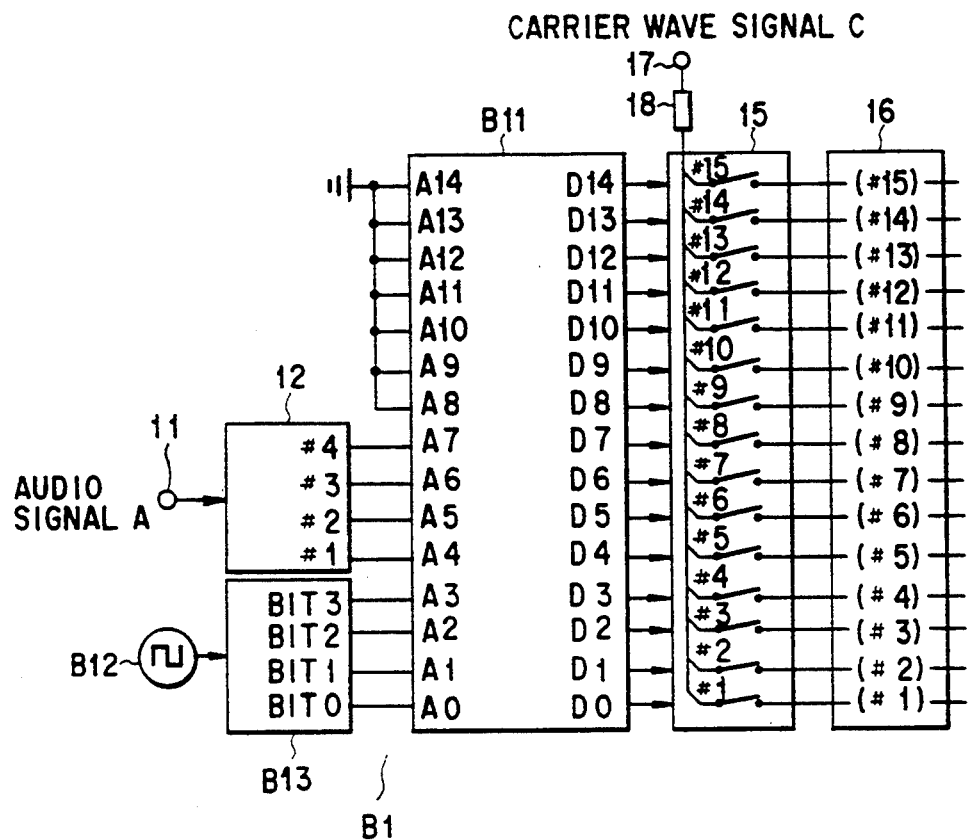
FIG. 7
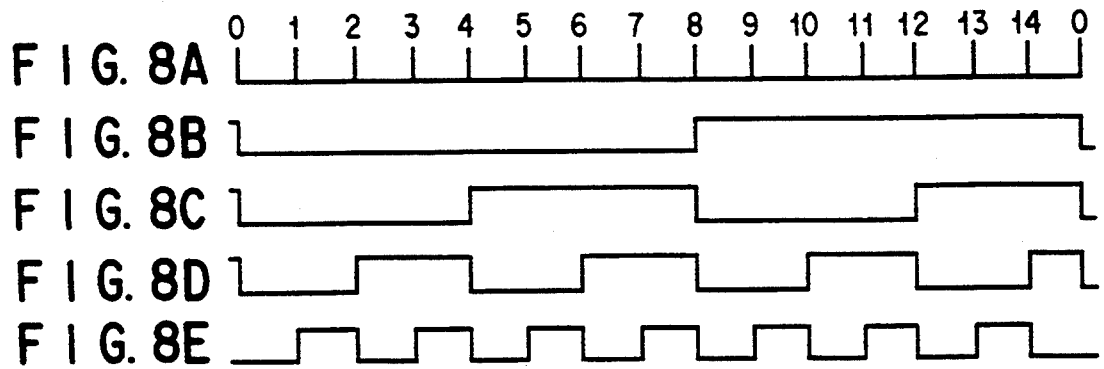

FIG. 9

DIGITAL AM TRANSMITTER

BACKGROUND OF THE INVENTION

1. Field of the Invention

This invention relates to a digital AM transmitter obtained by digitizing an AM transmitter for a medium frequency radio broadcast.

2. Description of the Related Art

FIG. 1 shows a typical conventional digital AM transmitter.

In FIG. 1, reference numeral 11 denotes an input terminal for a audio signal A. The signal A is supplied from the input terminal 11 to an A/D converter 12, where the signal is converted to a digital signal of, for example, 12 bits, as indicated by the binary number system ($2^0, 2^1, 2^2, \ldots 2^{11}$). All the bits of the digital signal are applied to a code unit 13 in a parallel manner.

The code unit 13 has 4095 output terminals (#1–#4095) corresponding to the 12-bit binary signal, and outputs a bit signal of "1" from one of the output terminals determined by the bit value of the bit signal. For example, when the value of "$2^0$" bit is 1 (i.e., when the value is 1 in the decimal number system), "1" is outputted to a bit signal output terminal #1. When the value of "$2^1$" bit is 1 (i.e., when the value is 2 in the decimal number system), "1" is outputted to two output terminals #2 and #3. Further, when the value of "$2^2$" bit is 1 (i.e., when the value is 4 in the decimal number system), "1" is outputted to four output terminals #4, #5, #6 and #7.

In other words, the code unit 13 outputs "1" from output terminals with smaller # numbers when the level of a audio signal is low, and outputs "1" from both output terminals with larger # numbers and those with smaller # numbers when the level of the audio signal is high.

The bit signals outputted from the output terminals #1–#4095 of the code unit 13 serve as switch control signals and are supplied to 4095 carrier wave switches (#1–#4095) 15, respectively.

Reference numeral 17 denotes an input terminal for receiving a carrier wave signal C. The carrier wave signal C supplied to the input terminal 17 is divided into 4095 portions by a carrier wave divider 18 and supplied to the carrier wave switches (#1–#4095) 15, respectively.

Each carrier wave switch 15 is electrically conductive when the switch control signal from the code unit 13 is "1", and nonconductive when the switch control signal is "0", thereby selectively receiving divided portions of the carrier wave signal C. Each of the received portions of the signal C is amplified by a corresponding one of 4095 power amplifiers 16 (#1–#4095) with a predetermined gain, and then supplied to a carrier wave combiner 19.

The carrier wave combiner 19 has 4095 transformers (#1–#4095). The primary winding of each transformer is connected to the output terminal of a corresponding one of the 4095 power amplifiers 16, and the secondary windings of the transformers are connected to one another in series. One end of the connected secondary windings is grounded, and the other end is used as an output terminal.

In the carrier wave combiner 19, constructed as above, when those portions of the carrier wave signal C which have been amplified by the power amplifiers 16 (#1–#4095) are supplied to the corresponding ones of the primary windings, they are combined and digitally summed up on the side of the secondary windings. A combined output is generated from the secondary windings, and is outputted as an amplitude modulated wave signal AM from an output terminal 21 after an unnecessary high frequency component of the combined output is removed by a bandpass filter 20.

The conventional AM transmitter, constructed as above, has a high level of efficiency and performance, but also carries the following drawbacks:

Since the code unit has output terminals corresponding to the quantizing step of an A/C converter, and generates "1" sequentially therefrom, in an order beginning from an output terminal with the smallest number, output terminals with larger numbers generate "1" only when the audio signal has a high level. On the other hand, output terminals with smaller numbers generate "1" when the audio signal has either a high level or a low level.

Therefore, the smaller the number of the output terminal is, the more often "1" is generated. As a result, power amplifiers corresponding to output terminals with smaller numbers operate for longer and hence generate a larger amount of heat than those corresponding to output terminals with larger numbers.

In summary, in the conventional digital AM transmitter, the operation time and the heating value are not uniform between the power amplifiers, and therefore it is possible that some amplifiers will be worn out earlier than others. This means that the power amplifiers cannot have a consistent level of reliability, which is a significant problem in the case of a great power transmitter such as a middle wave radio transmitter.

SUMMARY OF THE INVENTION

It is the object of the invention to provide a highly reliable digital AM transmitter, which incorporates a plurality of power amplifiers operable at a uniform frequency in use, and can be operated with a low heating value as a whole.

To attain the object, there is provided a digital AM transmitter for generating an amplitude modulation wave of a carrier wave signal by converting a audio signal, to be modulated, into a digital audio signal of plural bits and subjecting the digital audio signal to further digital processing, comprising:

encode means at least having input terminals and output terminals, the number of the input terminals corresponding to the number of upper bits of the digital audio signal, (in the context of this invention the term "upper bits" means the relative position of the bits in a data frame) and the number of the output terminals corresponding to a maximum value of the upper bits, the encode means receiving the upper bits of the digital audio signal through the input terminals, and outputting logical code signals of "1" from those of the output terminals which correspond to the digital value of the upper bits;

code shifting means having input terminals equal in number to the output terminals of the encode means, and output terminals equal in number to the output terminals of the encode means, the code shifting means receiving through the input terminals thereof the code signals of "1" outputted from the output terminals of the encode means, and selecting those of the output terminals thereof which correspond to the number of the code signals of "1" to generate driving signals from the selected output terminals, the selected output terminals being changed with the lapse of time;

carrier wave dividing means for dividing the carrier wave signal into a plurality of portions;

first power amplifier means for receiving those of the divided portions of the carrier wave signal, the number of which is equal to the number of the output terminals of the code shifting means, and amplifying the received portions in accordance with the driving signals from the output terminals of the code shifting means; and carrier wave combining means for combining the portions of the carrier wave signal which have been amplified by the first power amplifier means, into the amplitude modulation wave.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a block circuit diagram, showing a case where a code unit and the code shifter shown in FIG. 2 are formed integral as one body;

FIG. 7 is a block circuit diagram, showing a case where an EP-ROM is used as the code shifter of FIG. 2;

FIGS. 8A-8E are views of timing waveforms, useful in explaining the operation of the code shifter of FIG. 7; and FIG. 9 is a view, showing an example of the relationship between the inputs and outputs of the code shifter of FIG. 7.

DETAILED DESCRIPTION OF THE PREFERRED EMBODIMENTS

Figure 1:
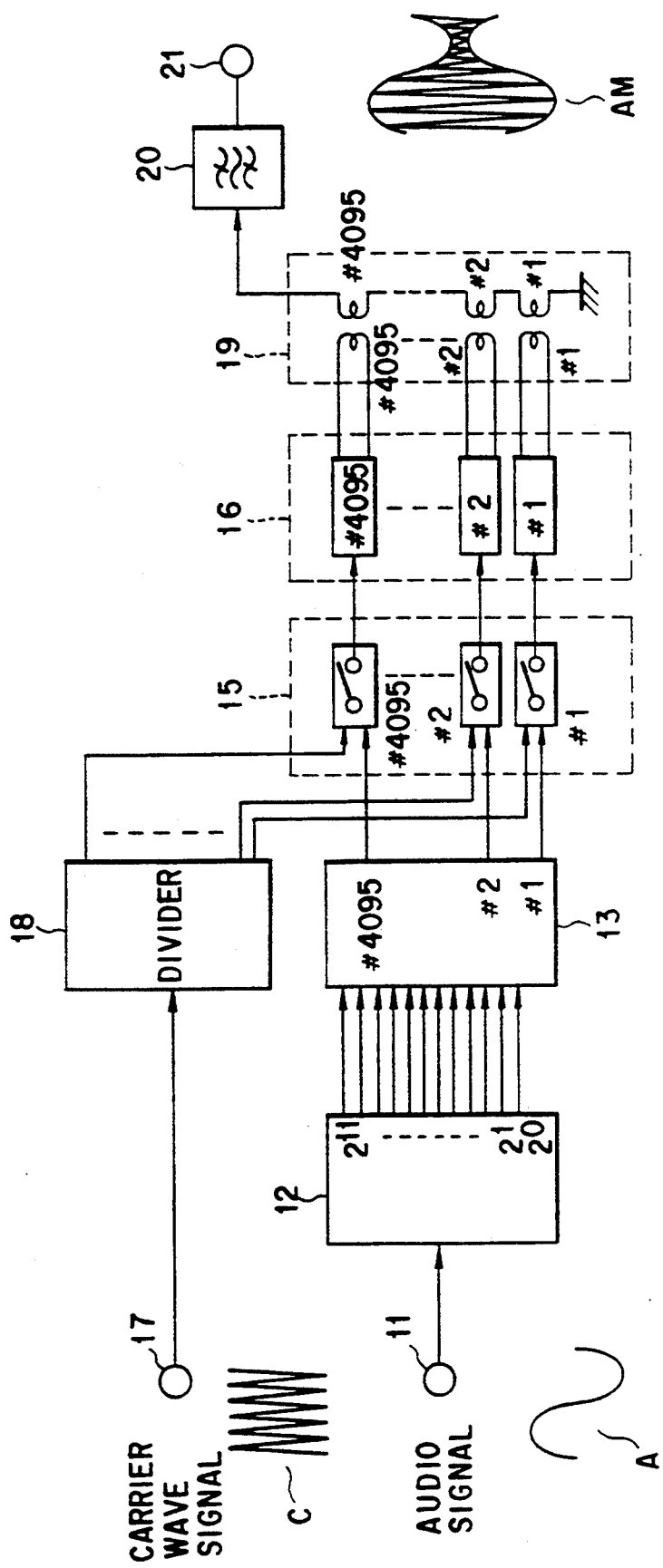
FIG. 1 is a block circuit diagram, showing a typical conventional digital AM transmitter.

An embodiment of the invention will be explained with reference to the circuit shown in FIG. 2.

Reference 11 denotes an input terminal for receiving a audio signal A. The audio signal A inputted to the input terminal 11 is applied to an A/D converter 12, where it is converted to a digital signal of, for example, 12 bits, indicated by the binary number system ($2^0$, $2^1$, $2^2$, ... $2^{11}$). All the bits of the digital signal are applied to a code unit 13 in a parallel manner.

A code unit 13 has 4095 output terminals (#1-#4095) corresponding to the 12-bit binary signal, and outputs a bit signal of "1" from one of the output terminals determined by the bit value of the bit signal.

For example, when the value of "$2^0$" bit is 1 (i.e., when the value is 1 in the decimal number system), "1" is outputted to a bit signal output terminal of #1. When the value of "$2^1$" bit is 1 (i.e., when the value is 2 in the decimal number system), "1" is outputted to two output terminals of #2 and #3. Further, when the value of "$2^2$" bit is 1 (i.e., when the value is 4 in the decimal number system), "1" is outputted to four output terminals of #4, #5, #6 and #7.

In other words, the code unit 13 outputs "1" from output terminals with smaller # numbers when the level of a audio signal is low, and outputs "1" from both output terminals with larger # numbers and those with smaller # numbers when the level of the audio signal is high.

The bit signals outputted from the output terminals #1-#4095 of the code unit 13 are supplied to the input terminals (#1-#4095) of a code shifter 14, respectively. The code shifter 14 has output terminals (#1-#4095) corresponding to the input terminals, and has a function for periodically shifting or selecting at random the destination of an input signal from each input terminal. The operation of the code shifter 14 will be explained in detail later.

Each signal from the output terminals (#1-#4095) of the code shifter 14 is supplied as a switch control signal to a corresponding one of 4095 carrier wave switches (#1-#4095) 15.

Reference numeral 17 denotes an input terminal for receiving a carrier wave signal C. The carrier wave signal C supplied to the input terminal 17 is divided into 4095 portions by a carrier wave divider 18 and supplied to the carrier wave switches (#1-#4095) 15, respectively.

Each carrier wave switch 15 is electrically conductive when the switch control signal from the code unit 13 is "1", and nonconductive when the switch control signal is "0", thereby selectively receiving divided portions of the carrier wave signal C. Each of the received portions of the signal C is amplified by a corresponding one of 4095 power amplifiers 16 (#1-#4095) with a predetermined gain, and then supplied to a carrier wave combiner 19.

The carrier wave combiner 19 has 4095 transformers (#1-#4095). The primary winding of each transformer is connected to the output terminal of a corresponding one of the 4095 power amplifiers 16, and the secondary windings of the transformers are connected to one another in series. One end of the connected secondary windings is grounded, and the other end is used as an output terminal.

In the carrier wave combiner 19 constructed as above, when those portions of the carrier wave signal C which have been amplified by the power amplifiers 16 (#1-#4095) are supplied to corresponding ones of the primary windings, they are combined and digitally summed up on the side of the secondary windings. A combined output is generated from the secondary windings, and is outputted as an amplitude modulated wave signal AM from an output terminal 21 after an unnecessary high frequency component of the combined output is removed by a bandpass filter 20.

The structure and operation of the power amplifier 16 is described in detail in U.S. Pat. No. 4,580,111, and hence no detailed explanations will be given thereof.

The operation of the circuit comprising the elements 12-16 will be explained with reference to FIG. 3. In FIG. 3, elements similar to those shown in FIG. 2 are denoted by corresponding reference numerals. Further, although in the case of FIG. 2, the audio signal A is converted to a 12-bit digital signal, the signal is converted to a 4-bit ($2^0$, $2^1$, $2^2$, $2^3$) digital signal in FIG. 3, for easy understanding.

The audio signal A supplied to the input terminal 11 is converted to a 4-bit digital signal by the A/D converter 12, which has four output terminals (#1-#4) connected to the input terminals (#1-#4) of the code unit 13, respectively.

The code unit 13 has four input terminals (#1-#4) and fifteen output terminals (#1-#15). The input terminal #1 connected to the $2^0$-bit output terminal of the A/D converter 12 is connected to the output terminal #1 via a buffer amplifier B1; the input terminal #2 connected to the $2^1$-bit output terminal is connected to the output terminals #2 and #3 via buffer amplifiers B2 and B3, respectively; the input terminal #3 connected to the $2^2$-bit output terminal is connected to the output terminals #4-#7 via buffer amplifiers B4-B7, respectively; and the input terminal #4 connected to the $2^3$-bit output terminal is connected to the output terminals #8-#15 via buffer amplifiers B8-B15, respectively. Thus, a number of signals of "1" corresponding to the number indicated by 4-bit data from the A/D converter 12 appear at the output terminals #1-#15.

The fifteen output terminals #1-#15 of the code unit 13 are connected to the fifteen input terminals (#1-#15) of the code shifter 14, respectively.

The code shifter 14 has a matrix type switch SW consisting of (15×15) switch elements arranged at the intersecting points of input/output lines (#1-#15) such that they connect the intersecting points. The input terminals #1-#15 of the converter 14 are connected to the input lines of the switch SW, while the output terminals #1-#15 are connected to the output lines of the switch SW.

The above matrix type switch SW can easily be realized by a logic IC, etc. The switching can be controlled by a switch control section (not shown) such that each input line is connected to an output line with a corresponding # number in an initial state, and is successively switched to other output lines in the order of # number, each time a clock generator CL raises a clock pulse of a predetermined frequency.

Specifically, at a certain point of time (t=n), intersecting points indicated by circles are connected. At a point of time (t=n+1) after a predetermined time (here, one clock) from the time point (t=n), intersecting points indicated by squares are connected. Further, at a point of time (t=n+2) after the predetermined time from the time point (t=n+1), intersecting points indicated by triangles are connected.

Thus, in the FIG. 3 embodiment, the on-state intersecting point shifts to the right (the rightmost point shifts to the leftmost point) each time a clock pulse rises. The input terminal #1, for example, is successively connected to the output terminals #1, #2, #3, ..., in this order with the lapse of time. Similarly, the input terminal #2 is successively connected to the output terminals #2, #3, #4, ..., in this order with the lapse of time.

The output terminals #1-#15 of the code shifter are connected to control input terminals corresponding to the carrier wave switches (#1-#15) 15, respectively. Each of the switches 15 is in the on-state when "1" has been applied thereto from a corresponding output terminal of the code shifter 14. As was explained referring to FIG. 2, the carrier wave signal C is applied to the power amplifiers (#1-#15) 16 via the on-state carrier wave switches (#1-#15) 15, thereby turning on the power amplifiers 16.

Figure 2:
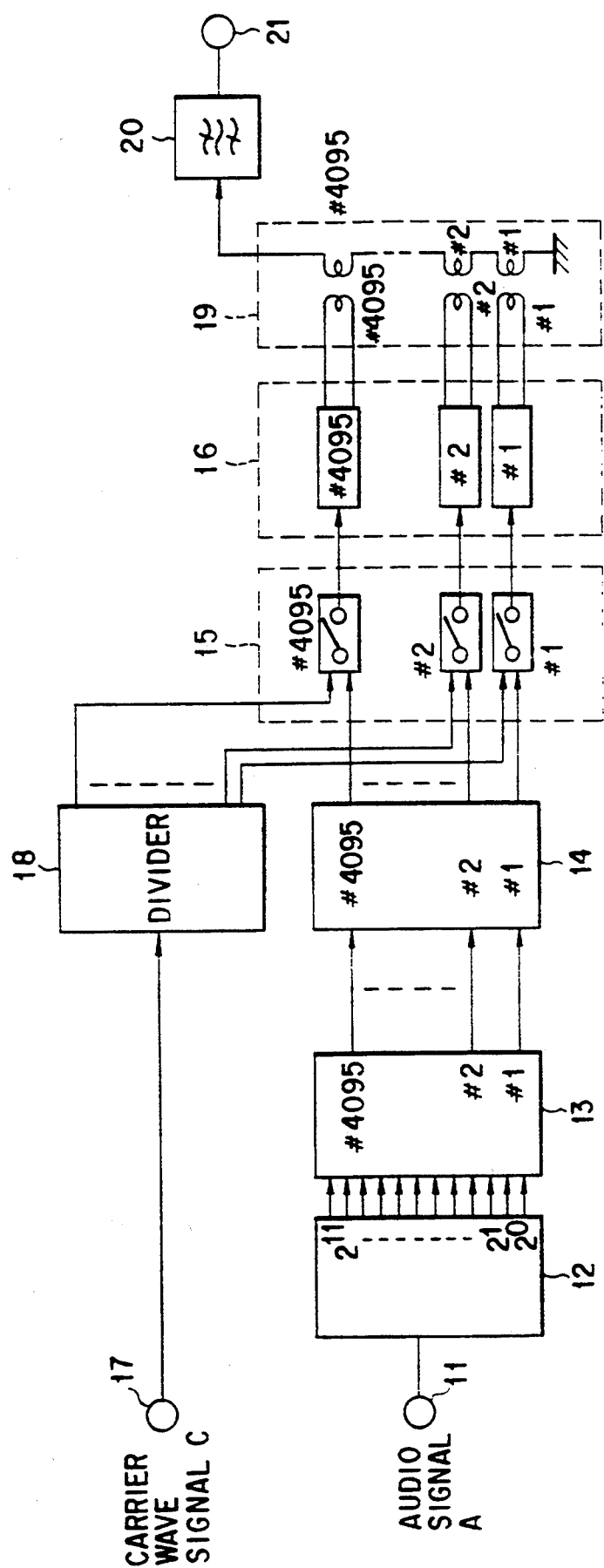
FIG. 2 is a block circuit diagram, showing a digital AM transmitter according to an embodiment of the invention.
Figure 3:
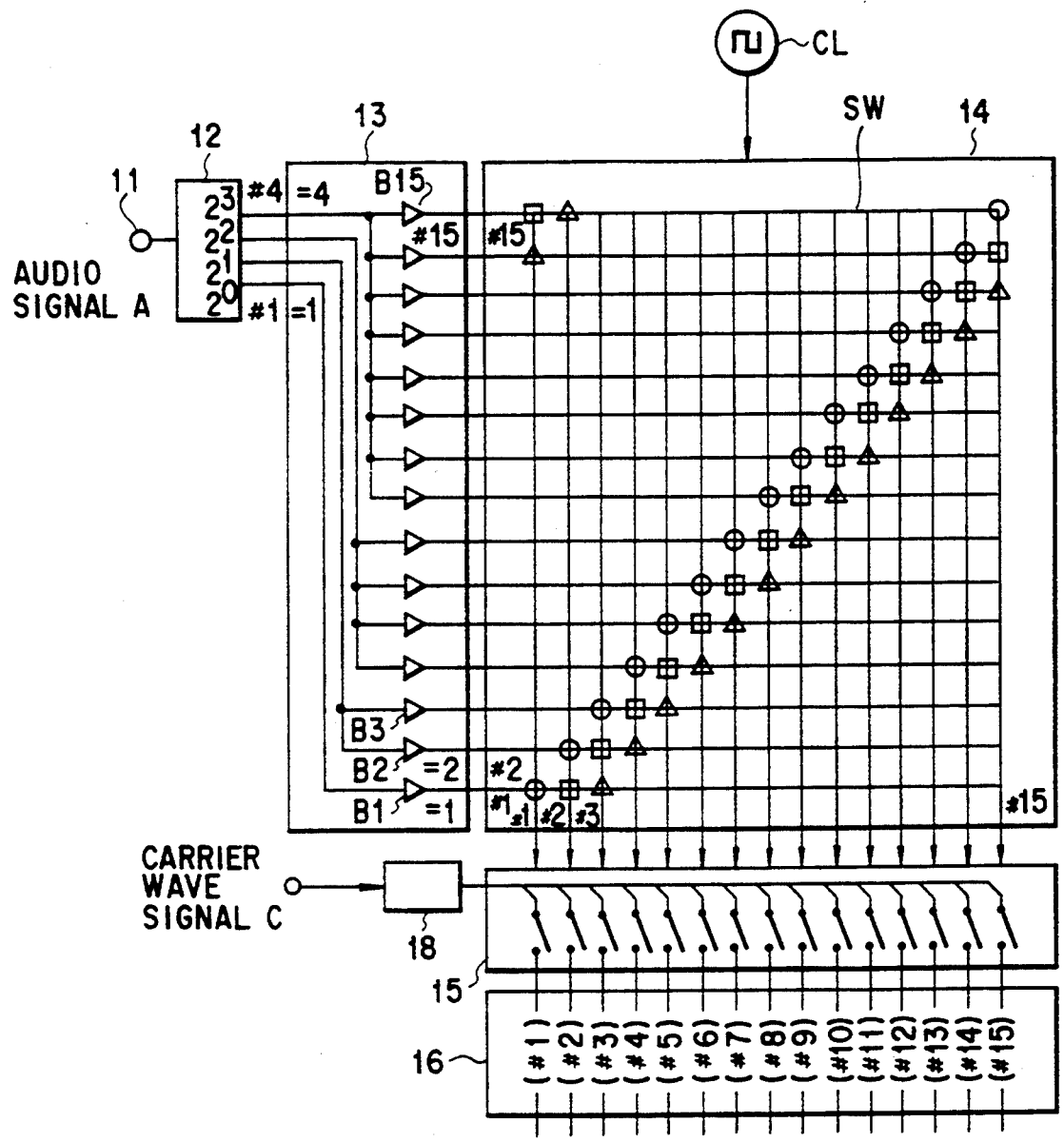
FIG. 3 is a block circuit diagram, showing the case of using a matrix type switch in a code shifter shown in FIG. 2.

Thus, in the FIG. 2 embodiment having a structure as shown in FIG. 3, even when audio signals A of the same level are applied, and signals are outputted from the same output terminal of the code unit 13, the switch elements of the matrix-type switch SW are switched from one to another each time a predetermined period of time elapses, and hence the on-state carrier wave switches 15 are shifted from one to another with the lapse of time. In other words, even when no level changes are found in the inputted audio signals A, there are no power amplifiers which operate concentratedly.

In particular, even when a audio signal A of a low level has been generated, the matrix type switch SW enables the uniform frequency of use of the power amplifiers 16 with both smaller numbers and larger numbers. Accordingly, the amplifiers 16 can each have uniform reliability, and the reliability of the overall system can be enhanced.

Further, increasing the frequency of the clock pulses increases the speed of switching the intersecting switch elements of the switch SW from one to another, and thus more equalizes the heating value of each power amplifier, with the result that the heating value of the overall system can be reduced.

Here, the heating value of the power amplifiers, obtained in the conventional case shown in FIG. 1 will be compared with that of the power amplifiers, obtained in the present case shown in FIG. 2. Since the heating value of the power amplifiers is proportional to the average output power of the power amplifiers, the average output power is used for the comparison.

In the conventional case, when the degree of modulation is 0%, a particular power amplifier is operated and generates heat. For example, if the transmitter has an output of 1 kW and the margin of peak modulation is 110%, the output power P1 of that one of the power amplifiers which is operated under no modulation conditions is given by $$P1 = \text{the average power of the transmitter/the number of power amplifiers being operated} \qquad (1)$$
$$= 1000 \text{ W}/((15 \times 1.1)/2)$$
$$= 1000/6.815 = 147 \text{ W}$$

In the case of the present invention, all the power amplifiers are operated in a uniform manner, and therefore the output power P2 of each amplifier is given by $$P2 = 1000 \text{ W}/15 = 67 \text{ W} \qquad (2)$$

Further, when the transmitter is under rated conditions or program modulation conditions (the degree of modulation is 40%), the average output of the transmitter is 1.08 times of that obtained under no modulation conditions. Accordingly, the output power P3 of each power amplifier is given by $$P3 = 1000 \text{ W} \times 1.08/15 = 72 \text{ W} \quad (3)$$

As is evident from equations (1)–(3), the heating value of each power amplifier is half or less of that obtained in the conventional case. As a result, the reliability of the system can be enhanced, the design of a radiator system be simplified, the total efficiency be increased, and the cost be reduced.

Although in the above code shifter 14, the intersecting points which connect the input terminal of the switch SW to the output terminal of the same are simultaneously shifted from some to others at regular intervals, the time points at which the shifting is performed can be partially changed. Moreover, the manner of shifting may be modified such that the fifteen intersecting points are divided into five groups each consisting of three intersecting points, and the shifting is performed in units of a group. In this case, too, the power loss of each power amplifier 16 can be substantially uniformed.

Although the operation of the 4-bit code shifter 14 has been explained, the operation of the 12-bit converter shown in FIG. 2 can be explained in a similar manner. Further, although in the embodiment, all bit conversion is performed by the converter 14, it is practically no problem to subject, in the 12 bit case, for example, only the upper 4 bits to code conversion, in view of the fact that "1" is generated relatively often with respect to lower bits.

Another embodiment of the invention will now be explained with reference to the block circuit diagram of FIG. 4. In the FIG. 4 embodiment, elements similar to those of FIG. 2 are denoted by corresponding reference numerals, and no detailed explanations will be given thereof.

Figure 4:
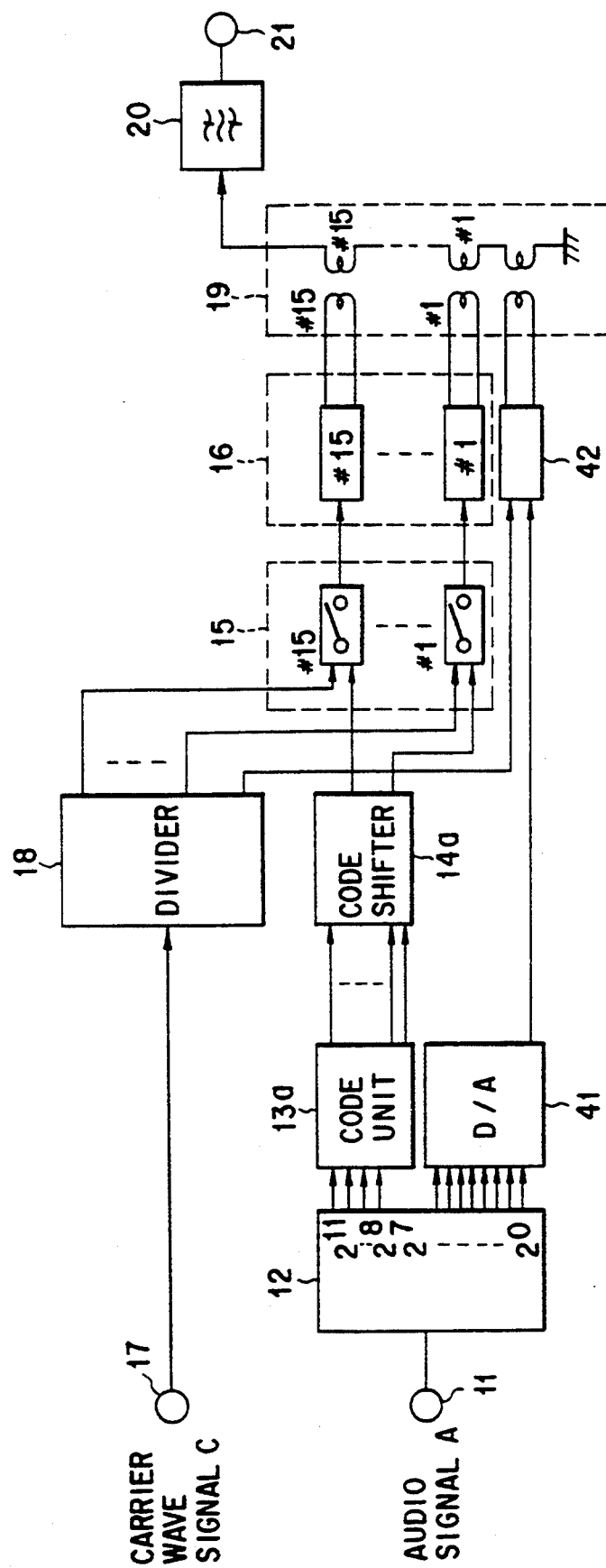
FIG. 4 is a block circuit diagram, showing another embodiment of the invention wherein lower bit outputs of an A/D converter shown in FIG. 2 are processed by analog processing.

In FIG. 4, the audio signal A inputted to the input terminal 11 is applied to the A/D converter 12, and converted to a 12-bit digital signal ($2^0$, $2^1$, $2^2$, ... $2^{11}$) indicated by the binary number system. The lower bits ($2^0$–$2^7$) of the digital signal are converted to analog bit signals by a D/A converter 22, and supplied to an analog power amplifier 23. A carrier wave signal C is supplied directly to the analog power amplifier 23 via the input terminal 17 and the divider 18. The carrier wave signal C is amplified in accordance with the level of analog bit signals applied from the D/A converter 22.

On the other hand, the upper bits ($2^8$–$2^{11}$) of the digital signal are applied to the carrier wave switches (#1–#15) 15 via a variable code unit 14a, and processed in a manner similar to that employed in the FIG. 3 embodiment.

The portions of the carrier wave signal which have been amplified by the power amplifiers (#1–#15) 16 and the analog power amplifier 23, respectively are combined by the carrier wave combiner 19 having #0–#15 transformers, and outputted as an amplitude modulation wave signal from the output terminal 21 through the bandpass filter 20.

At present, in the medium wave band, for example, a power amplifier of a minimum structure can output a power of about 1 kW. Thus, a transmitter of an output of 5–10 kW can be realized by employing 15 power amplifiers (corresponding to 4 bits).

In the FIG. 4 embodiment, the power amplifier unit comprises fifteen power amplifiers 16 and one analog power amplifier 23, and hence it is necessary to divide the carrier wave signal into sixteen portions by the divider 18.

The operation of the above-described embodiment will be explained. Since, as aforementioned, "1" is relatively often generated with respect to any of lower bits, it is practically no problem to subject only the upper 4 bits to code conversion in the 12 bit case, for example. Therefore, in the FIG. 4 embodiment, the lower bits ($2^0$–$2^7$) of the digital signal are amplified by analog processing, thereby decreasing the number of the power amplifiers and accordingly reducing the cost.

Further embodiments of the invention will be explained with reference to the block circuit diagrams of FIGS. 5 and 6. In these figures, elements similar to those shown in FIGS. 2 and 4 are denoted by corresponding reference numerals, and no detailed explanations will be given thereof.

Although in the FIG. 2 embodiment, the code unit 13 and the code shifter 14 are formed of different circuit blocks, in the FIG. 5 embodiment, the code unit 13 and the code shifter 14 are formed integral of a single circuit block B1. Similarly, although in the FIG. 4 embodiment, the code unit 13a and the code shifter 14a are formed of different circuit blocks, in the FIG. 6 embodiment, they are formed integral of a single circuit block B2.

Specifically, in the embodiment shown in FIG. 2 or 4, a digital signal corresponding to the audio signal A is converted to an output indicated by number determined by the digital value thereof in the code unit 13 or 13a, and then a switch control signal for selecting a power amplifier to be operated on the basis of the output of the code unit is created in the code shifter 14 or 14a.

Figure 6:
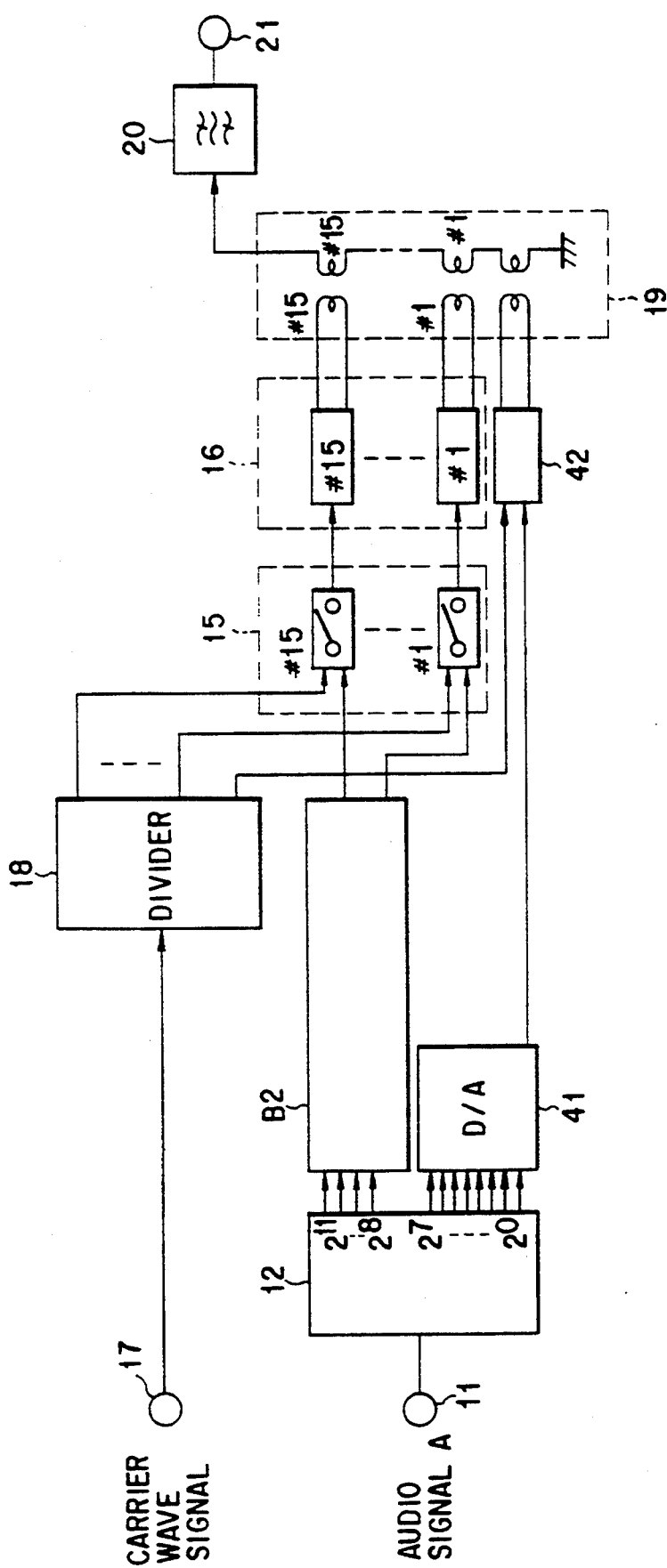
FIG. 6 is a block circuit diagram, showing a case where a code unit and a code shifter shown in FIG. 4 are formed integral as one body.

On the other hand, in the embodiment shown in FIG. 5 or 6, the code unit 13 or 13a and the code shifter 14 or 14a are formed integral as one block circuit, where a digital signal used for encoding is subjected to software processing or DSP (digital processing IC) processing so as to create a switch control signal for determining a power amplifier to be operated.

An EP-ROM (Erasable Programmable Read Only Memory) can be used to form a circuit serving as both the code unit and the code shifter.

FIG. 7 is a block circuit diagram, showing the case of using an EP-ROM as the circuit block B1 of FIG. 5. In FIG. 7, elements similar to those shown in FIG. 5 are denoted by corresponding reference numerals, and no detailed explanations will be given thereof. In addition, as in the FIG. 3 embodiment, the A/D converter 12 converts the audio signal A to a 4-bit ($2^0$, $2^1$, $2^2$, $2^3$) digital signal, for easy understanding.

In FIG. 7, the circuit block B1 constituting the code unit and the code shifter has an EP-ROM B11, a clock generator B12 and a quindecimal counter B13.

The clock generator B12 generates a series of clock pulses at the time points shown in FIG. 8A. The clock signal is added to the quindecimal counter B13, where it is converted to a quindecimal signal.

The quindecimal counter B13 has four bit terminals (bit 0–bit 3). A signal as shown in FIG. 8E is generated from the bit-0 terminal, a signal as shown in FIG. 8D is generated from the bit-1 terminal, a signal as shown in FIG. 8C is generated from the bit-2 terminal, and a signal as shown in FIG. 8B is generated from the bit-3 terminal. Hereinafter, the high level of the output of each bit terminal of the quindecimal counter B13 is indicated by "1", and the low level of the same is indicated by "0".

The outputs of the four bit terminals of the quindecimal counter B13 are supplied to input terminals A0-A3 of the EP-ROM B11, respectively. The audio signal A applied to the input terminal 11 is converted to a digital signal of 4 bits ($2^0$, $2^1$, $2^2$, $2^3$) by the A/D converter 12. Thus, the A/D converter 12 has four output terminals (#1-#4) connected to input terminals A4-A7 of the EP-ROM B11.

Although the EP-ROM B11 has sixteen input terminals and sixteen output terminals, eight input terminals A0-A7 and fifteen output terminals D0-D14 are used in the case of FIG. 7. Here, note that the EP-ROM B11 is an element wherein the combination of output terminals from which output signal are generated is determined directly by the combination of input terminals supplied with input signals. In this embodiment, the combinations of input signals and output signals are set, for example, as shown in FIG. 9.

Figure 9:
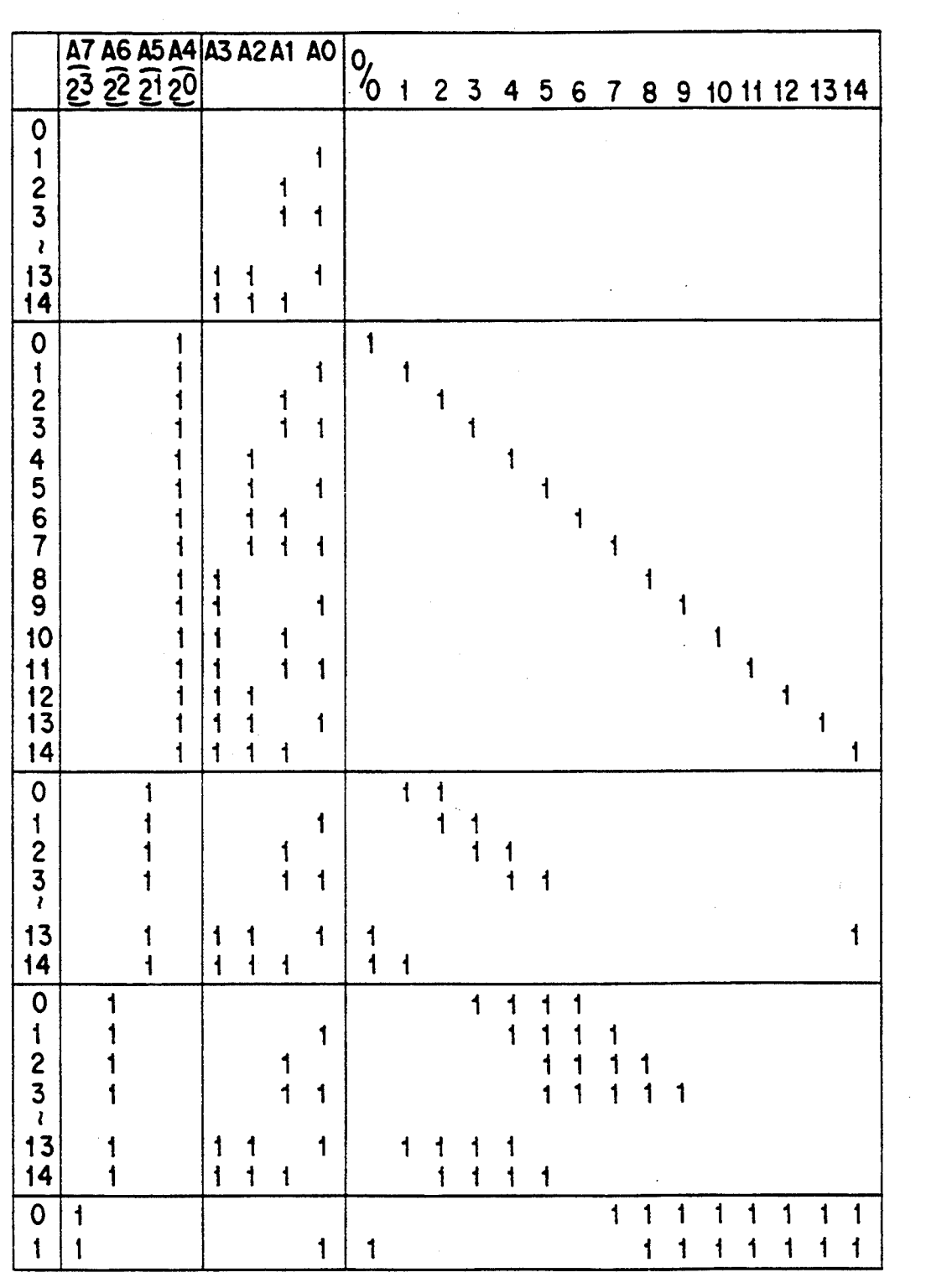

FIG. 9 shows a part of combinations, wherein A0-A7 in the east-west direction correspond to the input terminals A0-A7 of the EP-ROM B11, and D0-D14 in the same direction correspond to the output terminals. The values in the north-south direction are count values of the quindecimal counter B13, which repeats from 0 to 14.

In other words, FIG. 9 indicates which of the output terminals D0-D14 of the EP-ROM B11 generate signals, on the basis of the combination of the output of each of the four bit terminals of the quindecimal counter B13 and the bits of the digitized audio signal A. As regards the output terminals D0-D14, "1" indicates that they generate an output signal.

If there is no digitized audio signal, i.e., if the input terminals A4-A7 receive no bit signals, the output terminals D0-D14 generate no signals irrespective of the count value of the counter B13 (inputs to the input terminals A0-A3).

If the $2^0$ bit of the digital audio signal is at active level, i.e., if the input terminal A4 receives a bit signal, the output terminal D0 generates "1" when the count value of the counter B13 is "0". In this case, the larger the count value of the counter B13 is, the further right-side located output terminal generates If the $2^1$ bit of the digital audio signal is at active level, i.e., if the input terminal A5 receives a bit signal, two output terminals, e.g. D1 and D2, generate "1" when the count value of the counter B13 is "0". In this case, the larger the count value of the counter B13 is, the further right-side located output terminals generate "1" in units of two.

If the $2^2$ bit of the digital audio signal is at active level, i.e., if the input terminal A6 receives a bit signal, four output terminals, e.g. D3-D6, generate "1" when the count value of the counter B13 is "0". In this case, the larger the count value of the counter B13 is, the further right-side located output terminals generate "1" in units of four.

Lastly, if the $2^3$ bit of the digital audio signal is at active level, i.e., if the input terminal A7 receives a bit signal, eight output terminals, e.g. D7-D14, generate "1" when the count value of the counter B13 is "0". In this case, the larger the count value of the counter B13 is, the further right-side located output terminals generate "1" in units of eight.

Where a plurality of bits, e.g. $2^1$ bit and $2^2$ bit, of the digital audio signal are at active level, it should be considered that the state wherein the $2^1$-bit portion is in the on-state overlaps the state wherein the $2^2$ bit is at active level.

For example, when the count value of the counter B13 is "0", two output terminals D1 and D2 generate "1" in accordance with an input (corresponding to the $2^1$ bit) to the input terminal A5, and four output terminals D3-D6 generate "1" in accordance with an input (corresponding to the $2^2$ bit) to the input terminal A6. That is, six output terminals generate "1".

In this case, the larger the count value of the counter B13 is, the further right-side located output terminals generate "1" in units of six.

As explained above, in the EP-ROM B11, the output terminal D0-D14 from which a bit signal is generated is determined directly from the combination of a bit ($2^0$, $2^1$, $2^2$, $2^3$) portion(s) of the digitized audio signal and the count value of the quindecimal counter B13.

The outputs of the EP-ROM B11 are applied to the carrier wave switches (#1-#15) 15, thereby turning on them. As a result, the carrier wave bit signals C are applied to and amplified by the power amplifiers 16 (#1-#15), as in the FIG. 2 case. The bit signals C amplified by the amplifiers 16 are combined by the carrier wave combiner 19, filtered by the band filter 20, and outputted as an amplitude modulation wave from the output terminal 21.

In the above-described structure, even if audio signals A inputted have the same level, the output terminals from which signals are generated are changed from one to another (or from some to others) with the lapse of time in accordance with the count value of the quindecimal counter B13. Accordingly, the power amplifiers 16 to be used are changed with the lapse of time even when audio signals have the same level, and the concentrated use of a particular power amplifier is prevented.

The combination of each bit ($2^0$, $2^1$, $2^2$, $2^3$) portion of the digitized audio signal and the count values of the quindecimal counter B13 is not limited to that shown in FIG. 9, but can be modified in various manners. Although the above-described explanations have been given of the 4-bit case, similar explanations can be given of the 12-bit case.

Moreover, although in the above embodiments, all the bits of a digitized audio signal are processed, the invention is applicable also to the case of processing only part of the bits, e.g. upper or lower bits, of the digitized audio signal.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A digital AM transmitter for generating an amplitude modulation wave by converting a audio signal, to be modulated, into a digital audio signal of plural bits and subjecting the digital audio signal to further digital processing, comprising:

encode means at least having input terminals and output terminals, the number of the input terminals corresponding to the number of upper bits of the digital audio signal, and the number of the output terminals corresponding to a maximum value of the upper bits, the encode means receiving the upper bits of the digital audio signal through the input terminals, and outputting logical code signals of "1" from those of the output terminals which correspond to the digital value of the upper bits;

code shifting means having input terminals equal in number to the output terminals of the encode means, and output terminals equal in number to the output terminals of the encode means, the code shifting means receiving through the input terminals thereof the code signals of "1" outputted from the output terminals of the encode means, and selecting those of the output terminals thereof which correspond to the number of the code signals of "1" to generate driving signals from the selected output terminals, the selected output terminals being changed with the lapse of time;

carrier wave dividing means for dividing the carrier wave signal into a plurality of portions;

first power amplifier means for receiving those of the divided portions of the carrier wave signal, the number of which is equal to the number of the output terminals of the code shifting means, and amplifying the received portions in accordance with the driving signals from the output terminals of the code shifting means; and carrier wave combining means for combining the portions of the carrier wave signal which have been amplified by the first power amplifier means, into the amplitude modulation wave.

2. The digital AM transmitter according to claim 1, further comprising the following, when the encode means does not receive all bits of the digital audio signal:

digital/analog converting means for converting to an analog signal a lower bit signal of the digital audio signal which is not inputted to the encode means; and second power amplifier means for receiving divided portions of the carrier wave signal from the carrier wave dividing means, and amplifying the divided portions of the carrier wave signal in accordance with the analog signal outputted from the digital-/analog converting means;

and wherein the combining means simultaneously combined those divided portions of the carrier wave signal which have been amplified by the first power amplifier means, and those divided portions of the carrier wave signal which have been amplified by the second power amplifier means.

3. The digital AM transmitter according to claim 1, wherein the code shifting means changes the selection of only those of the output terminals which correspond to inputted upper bits of the digital audio signal.

4. The digital AM transmitter according to claim 1, wherein the code shifting means has a matrix-type switch for selectively connecting the input terminals to the output terminals, and connecting points of the switch are changed from one to another with the lapse of time.

5. The digital AM transmitter according to claim 1, wherein the encode means and the code shifting means are formed integral as one circuit.

6. The digital AM transmitter according to claim 5, wherein the circuit constituting the encode means and the code shifting means has a memory provided with output terminals whose number corresponds at least to a maximum value indicated by the upper bits of the digital audio signal, and bit signal generating means for generating a signal of a plurality of bits which change with the lapse of time; and the memory prestores output values of the output terminals corresponding to address signals, the address signals corresponding to the combinations of the upper bits of the digital audio signal and the bits of the signal generated by the bit signal generating means, and the output values of the output terminals being changed in accordance with a change in the address signal.

* * * * *